(12) United States Patent
Guo et al.

(10) Patent No.: US 9,178,179 B2
(45) Date of Patent: Nov. 3, 2015

(54) ELECTROLUMINESCENT DEVICE AND METHOD FOR PRODUCING THE SAME

(71) Applicants: Hefei BOE Optoelectronics Technology Co., Ltd., Anhui (CN); BOE Technology Group Co., Ltd., Beijing (CN)

(72) Inventors: Yuanhui Guo, Beijing (CN); Hui Wang, Beijing (CN); Chun Wang, Beijing (CN); Yisan Zhang, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/158,100

(22) Filed: Jan. 17, 2014

(65) Prior Publication Data

US 2014/0203258 A1 Jul. 24, 2014

(30) Foreign Application Priority Data

Jan. 24, 2013 (CN) .......................... 2013 1 0026142

(51) Int. Cl.
*H01J 1/62* (2006.01)
*H01L 51/52* (2006.01)

(52) U.S. Cl.
CPC ................................ *H01L 51/5268* (2013.01)

(58) Field of Classification Search
USPC .......................... 257/40, 98; 438/46; 313/501
See application file for complete search history.

(56) References Cited

U.S. PATENT DOCUMENTS

2004/0263060 A1* 12/2004 Gilmour et al. ............... 313/501
2012/0228656 A1* 9/2012 Kamiyama et al. ............. 257/98

FOREIGN PATENT DOCUMENTS

CN 101946341 A 1/2011

OTHER PUBLICATIONS

First Chinese Office Action for Chinese Patent Application No. 201310026142.0, dated Dec. 17, 2014, 8 pages.

* cited by examiner

*Primary Examiner* — David Vu
*Assistant Examiner* — Brandon Fox
(74) *Attorney, Agent, or Firm* — Westman, Champlin & Koehler, P.A.

(57) ABSTRACT

An electroluminescent device, comprising: a substrate; a first electrode and a second electrode disposed on the substrate; and an electroluminescent layer sandwiched between the first electrode and the second electrode, wherein at least one of the first and second electrodes is configured to have a grating structure; and wherein the grating structure has a grating period within a range of 0.9~1.1 times of a wavelength of a light wave generated in the electroluminescent layer.

18 Claims, 3 Drawing Sheets

ELECTROLUMINESCENT DEVICE AND METHOD FOR PRODUCING THE SAME

CROSS-REFERENCE TO RELATED APPLICATION

This application claims the benefit of Chinese Patent Application No. 201310026142.0 filed on Jan. 24, 2013 in the State Intellectual Property Office of China, the whole disclosure of which is incorporated herein by reference.

BACKGROUND OF THE INVENTION

1. Field of the Invention

The present invention relates to a technical field of display, more particularly, relates to an electroluminescent device and a method for producing the electroluminescent device.

2. Description of the Related Art

An organic light emitting diode (OLED) display panel has many excellent advantages, such as, self-luminescence without a back light source, high contrast ratio, small thickness, wide angle of view, quick response, flexibility, adaptability to a wide range of temperatures, simple configuration and manufacturing process, etc. Thereby, the OLED display panel is regarded as a next generation of flat panel display in new technology.

However, since about 30% of photons are limited by a total reflection of a glass substrate and about 50% of photons are limited by a transverse guided wave of an organic layer, only about 20% of photons can exit out of the OLED device. The external quantum efficiency of the OLED device at most reaches 17%. The low external quantum efficiency and light extraction efficiency cause the OLED device to have a low light efficiency, a large power consumption, a high chip heat, a short life, etc.

SUMMARY OF THE INVENTION

The present invention has been made to overcome or alleviate at least one aspect of the above mentioned disadvantages.

Accordingly, it is an object of the present invention to provide an electroluminescent device and a method for producing the same capable of decreasing a total reflection effect and a transverse wave-guide effect at an interface between an organic layer and an anode to increase photons emitted from the electroluminescent device, improve the light extraction efficiency, enhance the light efficiency and reduce the power consumption.

According to an aspect of the present invention, there is provided an electroluminescent device, comprising:

a substrate;

a first electrode and a second electrode disposed on the substrate; and an electroluminescent layer sandwiched between the first electrode and the second electrode, wherein at least one of the first and second electrodes is configured to have a grating structure; and wherein the grating structure has a grating period within a range of 0.9~1.1 times of a wavelength of a light wave generated in the electroluminescent layer.

According to another aspect of the present invention, there is provided an electroluminescent display apparatus comprising the above electroluminescent device.

According to still another aspect of the present invention, there is provided a method for producing an electroluminescent device, comprising steps of:

forming a first electrode having a grating structure on a substrate;

forming an electroluminescent layer, the first electrode being provided on one side of the electroluminescent layer; and forming a second electrode on the other side of the electroluminescent layer opposite to the one side, wherein the grating structure has a grating period within a range of 0.9~1.1 times of a wavelength of a light wave generated in the electroluminescent layer.

In an exemplary embodiment, forming a first electrode having a grating structure on a substrate comprising steps of:

spin coating a mixer containing polystyrene nanoparticles, methyl alcohol and dispersant on the substrate to form a polystyrene single molecular film on the substrate;

performing a plasma treatment on the surface of the substrate to enhance an adhesion force between the polystyrene nanoparticles and the substrate;

forming a first metal film layer on the substrate, wherein the first metal film layer having a thickness less than or equal to a diameter of the polystyrene nanoparticles;

removing the polystyrene nanoparticles embedded in the first metal film layer to form a plurality of holes in the first metal film layer; and forming a second metal film layer on the first metal film layer in which the plurality of holes are formed.

BRIEF DESCRIPTION OF THE DRAWINGS

The above and other features of the present invention will become more apparent by describing in detail exemplary embodiments thereof with reference to the accompanying drawings, in which.

LIST OF THE REFERENCE NUMERALS

Figure 1:
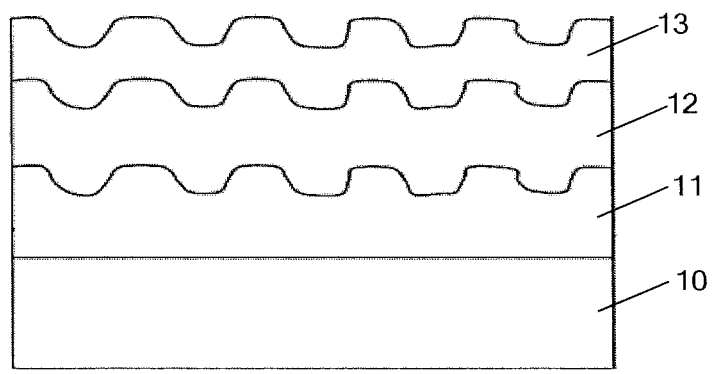
FIG. 1 is an illustrative cross section view of an electroluminescent device according to a first exemplary embodiment of the present invention.

10—substrate, 11—first electrode, 13—second electrode, 12—electroluminescent layer, 14—anode, 141—first metal film layer, 142—second metal film layer, 143—holes, 15—cathode, 20—polystyrene nanoparticle.

DETAILED DESCRIPTION OF PREFERRED EMBODIMENTS OF THE MENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

The present invention provides an electroluminescent device and a method for producing the same, both capable of decreasing a total reflection effect and a transverse waveguide effect at an interface between an organic layer and an anode to increase photons emitted from the electroluminescent device, improve the light extraction efficiency, enhance the light efficiency and reduce the power consumption.

The present invention provides an electroluminescent device, comprising: a substrate; a first electrode and a second electrode disposed on the substrate; and an electroluminescent layer sandwiched between the first electrode and the second electrode, wherein at least one of the first and second electrodes is configured to have a grating structure; and wherein the grating structure has a grating period corresponding to a wavelength of a light wave generated in the electroluminescent layer.

First Embodiment

In an exemplary embodiment, as shown in FIG. 1, there is provided the electroluminescent device, comprising: a substrate 10; a first electrode 11 and a second electrode 13 disposed on the substrate 10; and an electroluminescent layer 12 sandwiched between the first electrode 11 and the second electrode 13. At least one of the first and second electrodes 11, 13 is configured to have a grating structure; and the grating structure has a first grating period.

In an exemplary embodiment of the present invention, the first electrode 12 may be one of an anode and a cathode, and the second electrode may be the other of the anode and the cathode.

In an electroluminescent device, since the electroluminescent material and the electrode metal film have a high refraction index, the electroluminescent device has large transverse wave-guide loss (about 50%) therein. Thereby, in order to obtain an electroluminescent device with a high light efficiency, it is necessary to reduce the loss of optical coupling inside the electroluminescent device. Also, it is well known that a component of a light wave in a light wave vector plane is modulated if the grating period of the grating structure corresponds to the wavelength of the light wave, so that the light wave is limited within an emergent light cone and coupled as an emergent light, decreasing the optical coupling loss, increasing the number of photons emitted out of the device, and improving the light efficiency of the device. Based on the above principle, the present invention provides a period grating structure in the electroluminescent device. By means of an interaction of the grating structure with the light, the loss of optical coupling can be decreased, increasing the light extraction efficiency.

The electroluminescent device comprises an anode, a cathode and an electroluminescent layer sandwiched between the anode and the cathode. The electroluminescent layer may comprise one or more function layers, for example, cavity transport layer, luminescent layer, electron transport layer, etc. If one of the function layers is configured to have the grating structure, the performance of the one function layer or the other function layers may be decreased, for example, adversely affecting carrier injection and carrier transport. Thereby, in this exemplary embodiment, only the electrode (the anode or the cathode) is configured in a wave shape to form the grating structure.

In an exemplary embodiment, the grating structure may be a transmission grating structure. In this case, if the light emitted from the electroluminescent layer exits from the anode, then the anode may be configured to have the grating structure; if the light emitted from the electroluminescent layer exits from the cathode, then the cathode may be configured to have the grating structure; if the light emitted from the electroluminescent layer exits from both the anode and the cathode, then the anode and cathode both may be configured to have the grating structure. In another exemplary embodiment, the grating structure may be a reflection grating structure. In this case, if the light emitted from the electroluminescent layer exits from the cathode, then the anode may be configured to have the grating structure. In practice, selecting which one of the above production processes may be determined whether the production process is easily accomplished with considering the particular process flow. FIG. 1 only shows a particular structure of the electroluminescent device.

In the embodiment shown in FIG. 1, the first electrode 12 is configured to have the grating structure with an uneven thickness and a wave shape.

In the illustrated embodiments, the grating structure may be a structure capable of periodically spatially modulating a phase of an incident light. Also, the grating structure may be classified into the transmission grating structure (for modulating a transmission light) and the reflection grating structure (for modulating a reflection light) according to the operation manner. But the present invention is not limited to the illustrated embodiments, the grating structure may be any suitable structure as long as the grating structure can decrease the optical coupling loss and increase the light extraction efficiency when the grating period of the grating structure is set to substantially correspond to the wavelength of the light wave generated in the electroluminescent layer.

In an exemplary embodiment, considering the uniformity of the emergent light of the electroluminescent device, the grating structure may exhibit a structure of holes 143 distributed in an array.

In an exemplary embodiment, the grating period of the grating structure is set to approximately correspond to the wavelength of the light wave generated in the electroluminescent layer, and that the grating period of the grating structure may be less than or equal to the wavelength of the light wave generated in the electroluminescent layer. Thereby, in an exemplary embodiment, "the grating period" may be obtained based on the wavelength λ of the light wave generated in the electroluminescent layer with considering a deviation, generally, the grating period may be within a range of 0.9~1.1 times of the wavelength λ of the light wave generated in the electroluminescent layer.

In an exemplary embodiment, the grating period of the grating structure is set to approximately correspond to the wavelength of the light wave generated in the electroluminescent layer, that is, the grating period may be substantially equal to the wavelength λ of the light wave generated in the electroluminescent layer.

In the electroluminescent device of the present invention, the electrode in the direction of the light emitted from the electroluminescent device is configured to have the grating structure. Thereby, compared with the conventional electroluminescent device in the prior art, the electroluminescent device of the present invention can decrease the total reflection effect and the transverse wave-guide effect at the interface between the electroluminescent layer and the electrode, increase the number of the photons emitted from the electroluminescent device, improve the light extraction efficiency, enhance the light efficiency and reduce the power consumption.

Second Embodiment

Figure 2:
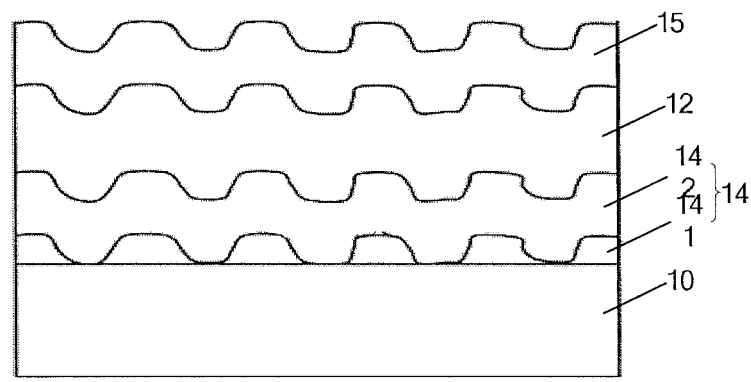
FIG. 2 is an illustrative cross section view of an electroluminescent device according to a second exemplary embodiment of the present invention.
Figure 3:
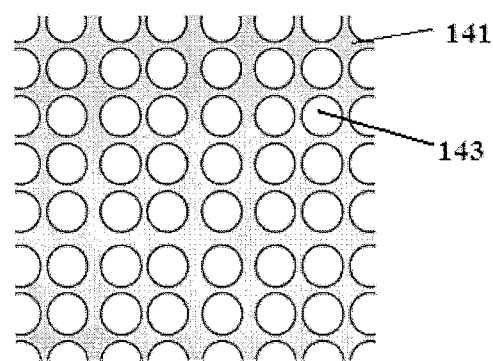
FIG. 3 is an illustrative plan view of a first metal film layer as an anode of the electroluminescent device according to the second exemplary embodiment of the present invention.

In an exemplary embodiment, as shown in FIG. 2, there is provided an electroluminescent device, comprising: a substrate 10; an anode 14 and a cathode 15 disposed on the substrate 10; and an electroluminescent layer 12 sandwiched between the anode 14 and the cathode 15. The light emitted from the electroluminescent device exits from the bottom thereof, and the anode 14 is disposed in the direction of the light emitted from the electroluminescent device. The anode 14 comprises: a first metal film layer 141, in which a plurality of holes 143 disposed in an array, as shown in FIG. 3; and a second metal film layer 142 covered on the first metal film layer 141.

On one side of the second metal film layer 142 a plurality of protrusions corresponding to the plurality of holes 143 of the first metal film layer 141 are formed and protruded into the respective holes 143. On the other side of the second metal film layer 142 a plurality of recesses respectively corresponding to the plurality of protrusions are formed. In this way, the anode 14 is configured to have the grating structure and does not adversely affect the electroluminescent device to emit the light.

During forming the grating structure, it is necessary to perform a solution immerse and ultrasonic wave process on a surface of a semi-finished device, and it may adversely affect the structure and performance of the finished function layers because the metal material is very hard. Thereby, in design, the electrode is configured to have the grating structure so as to prevent the subsequent process from adversely affecting the grating structure.

In this embodiment, the anode of the electroluminescent device comprises two layers, the first layer is the first metal film layer in which a plurality of holes 143 are disposed in an array, and the second layer is the second metal film layer 142 covered on the first metal film layer 141. The holes in the electrode (for example, the anode) may increase the light transmission rate. In design, the anode is configured to have the grating structure to increase the light transmission efficiency of the electroluminescent device.

In an exemplary embodiment, the first metal film layer 141 and the second metal film layer 142 may be made of the same metal material or different metal materials. In an exemplary embodiment, the first metal film layer 141 may have a thickness of about 10 nm~20 nm, and the second metal film layer 142 may have a thickness of about 10 nm~20 nm. For example, the first metal film layer 141 may be a samarium metal film layer having a thickness of 10 nm, and the second metal film layer 142 may be a silver metal film layer having a thickness of 10 nm. Alternatively, the first metal film layer 141 may be a silver metal film layer having a thickness of 10 nm, and the second metal film layer 142 may be a silver metal film layer having a thickness of 15 nm.

In an exemplary embodiment, the holes 143 in the first metal film layer 141 may have a diameter of about 1 nm~1000 nm.

When nanoparticles (polystyrene nanoparticles) contained in the first metal film layer 141 sequentially have a diameter of 200 nm, 300 nm and 400 nm while other layers of the electroluminescent device are remained the same, both the maximum external quantum efficiency and the maximum brightness of the electroluminescent device are decreased with the increase of the diameter of the nanoparticles, because the micro-lens array in the grating structure can more effectively destroy the microcavity effect of the electroluminescent device and increase the light transmission efficiency with the decrease of the diameter of the nanoparticles.

In an exemplary embodiment, the electroluminescent layer may be an organic light emitting layer.

In this embodiment, the polystyrene nanoparticles form the micro-lens array, the first metal film layer has the array structure of holes, and the second metal film layer is covered on the first metal film layer. As a result, the anode having the grating structure is formed. With such configured anode, the optical coupling loss is decreased and the light extraction efficiency is increased by means of an interaction of the grating structure with the light emitted from the electroluminescent device. Also, compared with non-hole structure, the array structure of holes can increase the light transmission through the anode.

Please be noted that the present invention is not limited to the illustrated embodiments, the cathode of the electroluminescent device may be configured with two layers like the anode, so that the cathode is formed with the grating structure. The material and method for producing the cathode may be slightly different from those for producing the anode.

Third Embodiment

According to another exemplary embodiment of the present invention, there is also provided an electroluminescent display apparatus comprising any one of the electroluminescent devices mentioned in the above embodiments. The electroluminescent display apparatus may be any product or member with a display function, such as, an electronic paper, OLED panel, a mobile telephone, a panel computer, a TV, a display, a notebook PC, a digital photo frame, a navigator, etc. The electroluminescent display apparatus is incorporated with the electroluminescent device having the high light transmission rate, thereby it has many advantages, such as, high brightness, low power consumption, etc.

Fourth Embodiment

According to another exemplary embodiment of the present invention, there is also provided a method for producing an electroluminescent device, comprising steps of:

S101: forming a first electrode having a grating structure on a substrate;

S102: forming an electroluminescent layer on the first electrode; and

S103: forming a second electrode on a side of the electroluminescent layer opposite to the first electrode.

In the step S101, the first electrode having the grating structure may be formed by holography, photolithography or interference lithography.

The steps S102 and S103 may be accomplished by the conventional processes, and the description thereof is omitted herein.

In the above method, the first electrode is configured to have the grating structure, the total reflection effect and the transverse wave-guide effect at the interface between the electroluminescent layer and the electrode are decreased, increasing the number of the photons emitted from the electroluminescent device, improving the light extraction efficiency, enhancing the light efficiency and reducing the power consumption.

Hereafter, it will take the electroluminescent device of the second embodiment as an example to describe in detail the method for producing the electroluminescent device of the present invention so that those skilled in this art can understand the present invention well.

Figure 4:
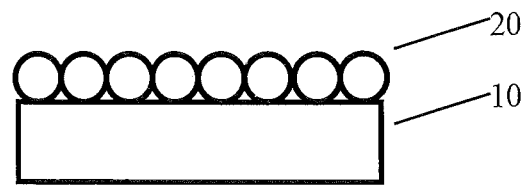
FIG. 4(a) is an illustrative cross section view of an electroluminescent device according to a fourth exemplary embodiment of the present invention, after spin coating a polystyrene single molecular film.
FIG. 4(b) is an illustrative plan view of the electroluminescent device according to the fourth exemplary embodiment of the present invention after spin coating the polystyrene single molecular film.
Figure 4:
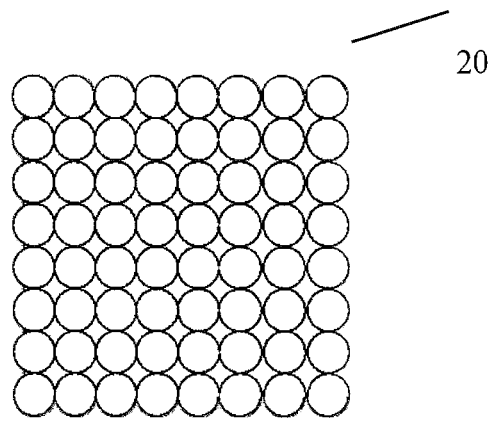
Figure 5:
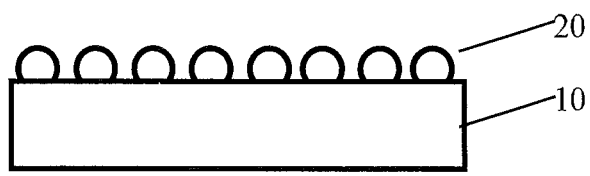
FIG. 5(a) is an illustrative cross section view of the electroluminescent device according to the fourth exemplary embodiment of the present invention after performing an oxygen plasma treatment on the surface of the polystyrene single molecular film.
FIG. 5(b) is an illustrative plan view of the electroluminescent device according to the fourth exemplary embodiment of the present invention after performing an oxygen plasma treatment on the surface of the polystyrene single molecular film.
Figure 5:
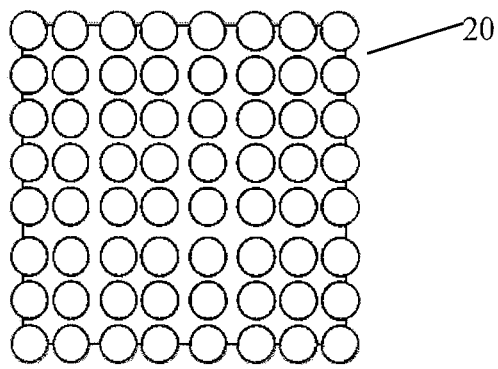
Figure 6:
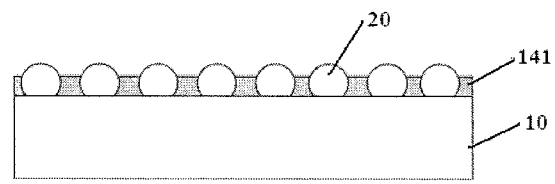
FIG. 6 is an illustrative cross section view of the electroluminescent device according to the fourth exemplary embodiment of the present invention after evaporating a first metal film layer.
Figure 7:
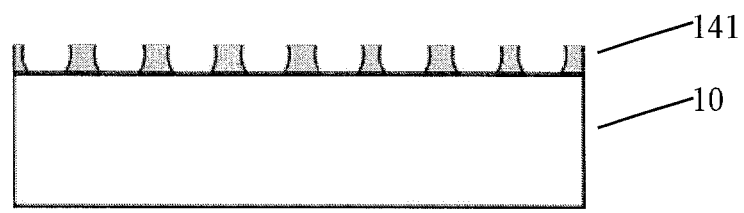
FIG. 7(a) is an illustrative cross section view of the electroluminescent device according to the fourth exemplary embodiment of the present invention after being cleaned by an ultrasonic wave.
FIG. 7(b) is an illustrative plan view of the electroluminescent device according to the fourth exemplary embodiment of the present invention after being cleaned by an ultrasonic wave.
Figure 7:
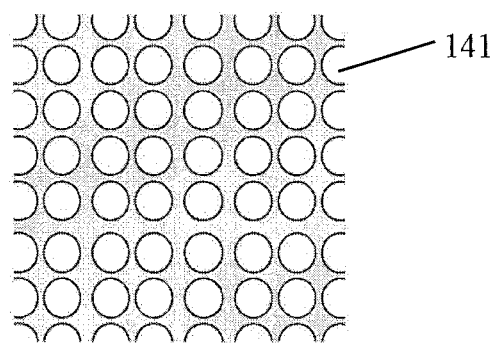
Figure 8:
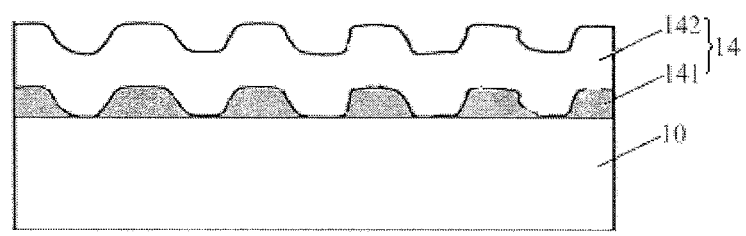
FIG. 8 is an illustrative cross section view of the electroluminescent device according to the fourth exemplary embodiment of the present invention after evaporating a second metal film layer.

The method for producing the electroluminescent device of the second embodiment comprising steps of:

1) sequentially placing the substrate into acetone, ethyl alcohol and deionized water and cleaning the substrate with the ultrasonic wave for about 10 minutes, then drying the substrate in a dryer;

2) spin coating a mixer containing polystyrene nanoparticles, methyl alcohol and dispersant on the substrate, and performing a plasma treatment on the surface of the substrate, so that the nanoparticles are regularly arranged on the surface of the substrate, and that a polystyrene single molecular film is formed on the substrate by controlling the concentration of the nanoparticles solution and the spin coating speed, and resting the processed substrate for a time, as shown in FIGS. 4(a) and 4(b), the polystyrene nanoparticles 20 are regularly arranged on the surface of the substrate 10;

3) performing an oxygen plasma treatment on the surface of the substrate to reduce the diameter of the polystyrene nanoparticles 20 and enhance an adhesion force between the polystyrene nanoparticles and the substrate, so that the polystyrene nanoparticles 20 cannot be peeled off the surface of the substrate during the subsequent evaporation, as shown in FIGS. 5(a) and 5(b);

4) placing the substrate into a vacuum chamber and evaporating or depositing a layer of metal film layer on the surface of the substrate, the thickness of the metal film layer is less than or equal to the diameter of the polystyrene nanoparticles, and the metal film layer is the first metal film layer 141 of the anode, since the first metal film layer 141 is very thin (the thickness thereof no larger than 20 nm), the polystyrene nanoparticles 20 are embedded in the first metal film layer 141, as shown in FIG. 6;

5) immersing the first metal film layer in a solution of ethanol and isopropanol, and removing the polystyrene nanoparticles 20 embedded in the first metal film layer by an ultrasonic wave, as shown in FIGS. 7(a) and 7(b);

6) further evaporating or depositing a second metal film layer 142 on the first metal film layer 141, as shown in FIG. 8, the second metal film layer 142 and the first metal film layer 141 may be made of the same material or different materials, for the purpose of simplification, the second metal film layer 142 and the first metal film layer 141 are made of the same material;

7) evaporating or spin coating the electroluminescent layer on the second metal film layer 142;

8) evaporating or spin coating the cathode on the electroluminescent layer.

In a method for producing the electroluminescent device according to an exemplary embodiment, the anode of the electroluminescent device comprises two layers, the first layer is the first metal film layer 141 in which a plurality of holes 143 are disposed in an array, and the second layer is the second metal film layer 142 covered on the first metal film layer 141. The holes in the electrode (for example, the anode) may increase the light transmission rate. Also, the anode is configured to have the grating structure to increase the light transmission efficiency of the electroluminescent device.

In the electroluminescent device, the method for producing the electroluminescent device, and the electroluminescent display apparatus comprising the electroluminescent device, the first electrode of the electroluminescent device in the direction in which the light emitted out of the electroluminescent device is configured to have the grating structure, and the grating period of the grating structure approximately corresponds to the wavelength of the light wave generated in the electroluminescent layer. Thereby, the component of the light wave in the light wave vector plane is modulated so that the light wave is limited within an emergent light cone and coupled as an emergent light, decreasing the optical coupling loss, increasing the number of photons emitted out of the device, improving the light extraction efficiency of the device, decreasing the total reflection effect and the transverse wave effect at the interface between the organic layer and the first electrode, enhancing the light efficiency and reducing the power consumption.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle, so that more kinds of electroluminescent device can be achieved with overcoming the technical problem of the present invention.

What is claimed is:

1. An electroluminescent device, comprising:
a substrate;
a first electrode and a second electrode disposed on the substrate; and
an electroluminescent layer sandwiched between the first electrode and the second electrode,
wherein at least one of the first and second electrodes is configured to have a grating structure; and
wherein the grating structure has a grating period within a range of 0.9~1.1 times of a wavelength of a light wave generated in the electroluminescent layer;
wherein the first electrode comprises:
a first metal film layer, in which a plurality of holes are disposed in an array to form a first grating structure; and
a second metal film layer covered on the first metal film layer to form a second grating structure,
wherein on one side of the second metal film layer a plurality of protrusions corresponding to the plurality of holes are formed and protruded into the respective holes of the first metal film layer, and wherein on the other side of the second metal film layer a plurality of recesses corresponding to the plurality of protrusions are formed.

2. The electroluminescent device according to claim 1, wherein the grating period of the grating structure is set to be equal to the wavelength of the light wave generated in the electroluminescent layer.

3. The electroluminescent device according to claim 1, wherein the light emitted from the electroluminescent layer exits from the first electrode; and
wherein the second electrode is configured to have the grating structure.

4. The electroluminescent device according to claim 1, wherein the electrode in a direction in which the light emits from the electroluminescent layer is configured to have the grating structure.

5. The electroluminescent device according to claim 1, wherein the electrode having the grating structure is formed in a wave shape.

6. The electroluminescent device according to claim 1, wherein the grating structure exhibits a structure of holes distributed in an array.

7. The electroluminescent device according to claim 1, wherein the holes have a diameter of 1 nm~1000 nm.

8. The electroluminescent device according to claim 1, wherein the first metal film layer and the second metal film layer have a thickness of 10 nm~20 nm.

9. The electroluminescent device according to claim 1, wherein the first and second metal film layers are made of the same material.

10. The electroluminescent device according to claim 1, wherein the first metal film layer is a samarium metal film layer, and the second metal film layer is a silver metal film layer.

11. The electroluminescent device according to claim 1, wherein the first electrode is an anode.

12. The electroluminescent device according to claim 1, wherein the electroluminescent layer is an organic light emitting layer.

13. An electroluminescent display apparatus comprising an electroluminescent device according to claim 1.

14. A method for producing an electroluminescent device, comprising steps of:
forming a first electrode having a grating structure on a substrate;
forming an electroluminescent layer, the first electrode being provided on one side of the electroluminescent layer; and
forming a second electrode on the other side of the electroluminescent layer opposite to the one side,
wherein the grating structure has a grating period within a range of 0.9~1.1 times of a wavelength of a light wave generated in the electroluminescent layer;
wherein the step of forming a first electrode having a grating structure on a substrate comprising steps of:
spin coating a mixer containing polystyrene nanoparticles, methyl alcohol and dispersant on the substrate to form a polystyrene single molecular film on the substrate;
performing a plasma treatment on the surface of the substrate to enhance an adhesion force between the polystyrene nanoparticles and the substrate;
forming a first metal film layer on the substrate, wherein the first metal film layer having a thickness less than or equal to a diameter of the polystyrene nanoparticles;
removing the polystyrene nanoparticles embedded in the first metal film layer to form a plurality of holes in the first metal film layer; and
forming a second metal film layer on the first metal film layer in which the plurality of holes are formed.

15. The method according to claim 14, wherein the step of removing the polystyrene nanoparticles embedded in the first metal film layer comprising:
immersing the first metal film in a solution of ethanol and isopropanol, and removing the polystyrene nanoparticles embedded in the first metal film by an ultrasonic wave.

16. The method according to claim 14, wherein the step of performing a plasma treatment on the surface of the substrate comprising:
performing an oxygen plasma treatment on the surface of the substrate to reduce the diameter of the polystyrene nanoparticles.

17. The method according to claim 16,
wherein in the step of spin coating a mixer containing polystyrene nanoparticles, methyl alcohol and dispersant on the substrate, performing an ultrasonic wave process on the surface of the substrate, so that the polystyrene nanoparticles are regularly arranged on the surface of the substrate.

18. The method according to claim 14,
wherein the step of forming an electroluminescent layer comprising: evaporating or spin coating the electroluminescent layer on the second metal film layer;
wherein the step of forming a second electrode comprising: evaporating or depositing the second electrode on the electroluminescent layer.

* * * * *